US009590529B2

(12) United States Patent
Akiyama

(10) Patent No.: US 9,590,529 B2
(45) Date of Patent: Mar. 7, 2017

(54) POWER CONVERSION DEVICE

(71) Applicant: Hitachi, Ltd., Chiyoda-ku, Tokyo (JP)

(72) Inventor: Satoru Akiyama, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 100 days.

(21) Appl. No.: 14/422,371

(22) PCT Filed: Sep. 28, 2012

(86) PCT No.: PCT/JP2012/075006
§ 371 (c)(1),
(2) Date: Feb. 19, 2015

(87) PCT Pub. No.: WO2014/049808
PCT Pub. Date: Apr. 3, 2014

(65) Prior Publication Data
US 2015/0207429 A1 Jul. 23, 2015

(51) Int. Cl.
*H02H 7/122* (2006.01)
*H02M 7/537* (2006.01)
(Continued)

(52) U.S. Cl.
CPC ........ *H02M 7/537* (2013.01); *H01L 23/4952* (2013.01); *H01L 23/49562* (2013.01); *H01L 24/49* (2013.01); *H01L 25/00* (2013.01); *H02M 1/088* (2013.01); *H02M 3/156* (2013.01); *H02M 7/5387* (2013.01); *H03K 17/0822* (2013.01); *H03K 17/165* (2013.01); *H01L 24/05* (2013.01);
(Continued)

(58) Field of Classification Search
CPC .... H02M 7/538; H02M 7/53806; H02M 1/32; H02M 1/38; H02M 1/34; H02M 1/40

USPC .......................................... 363/56.02–56.08
See application file for complete search history.

(56) References Cited

U.S. PATENT DOCUMENTS 6,717,785 B2 * 4/2004 Fukuda ................ H03K 17/168
361/86
2003/0107905 A1 * 6/2003 Miura ................. H01L 29/7803
363/41

FOREIGN PATENT DOCUMENTS

JP 2005-110366 A 4/2005
JP 2006-042512 A 2/2006

OTHER PUBLICATIONS

Das, Mrinal K., Commercially Available Cree Silicon Carbide Power Devices: Historical Success of JBS Diodes and Future Power Switch Prospects, CS Mantech Conference, May 16th-19th, 2011, Palm Springs, California, USA.

(Continued)

*Primary Examiner* — Nguyen Tran
(74) *Attorney, Agent, or Firm* — Miles & Stockbridge P.C.

(57) ABSTRACT

An uneven return current is prevented and increase in a loss is suppressed in a power conversion apparatus at the time of inverter operation. The invention includes first and second transistor switch groups in each of which arms are connected in parallel, and sense resistors for detecting a drain current are connected to the first and second transistor switch groups, and a first drive circuit group and the second drive circuit group include means for monitoring a sense current flowing through the sense resistors and a plurality of delay circuits. Further, rising of the plurality of transistor switch groups is controlled by controlling activation and non-activation of the plurality of delay circuits on the basis of a magnitude of the sense current.

12 Claims, 12 Drawing Sheets

(51) Int. Cl.

| | |
|---|---|
| H02M 1/088 | (2006.01) |
| H02M 3/156 | (2006.01) |
| H02M 7/5387 | (2007.01) |
| H01L 25/00 | (2006.01) |
| H03K 17/082 | (2006.01) |
| H03K 17/16 | (2006.01) |
| H01L 23/495 | (2006.01) |
| H02M 1/00 | (2006.01) |
| H01L 23/00 | (2006.01) |

(52) U.S. Cl.
CPC ............ *H01L 24/06* (2013.01); *H01L 24/48* (2013.01); *H01L 2224/02166* (2013.01); *H01L 2224/04042* (2013.01); *H01L 2224/0603* (2013.01); *H01L 2224/48091* (2013.01); *H01L 2224/48137* (2013.01); *H01L 2224/48139* (2013.01); *H01L 2224/48247* (2013.01); *H01L 2224/48472* (2013.01); *H01L 2224/4903* (2013.01); *H01L 2224/49111* (2013.01); *H01L 2224/49113* (2013.01); *H01L 2224/49175* (2013.01); *H01L 2224/49433* (2013.01); *H01L 2924/00014* (2013.01); *H01L 2924/10272* (2013.01); *H01L 2924/13091* (2013.01); *H01L 2924/181* (2013.01); *H01L 2924/19107* (2013.01); *H02M 2001/0009* (2013.01); *H02M 2001/0054* (2013.01); *Y02B 70/1491* (2013.01)

(56) References Cited

OTHER PUBLICATIONS

Shen et al., "Atomic-scale origins of bias-temperature instabilities in SiC-SiO$_2$ structures", Applied Physics Letters 98, (063507)-1-(063507)-3, 2011.

Lelis et al., Time Dependence of Bias-Stress-Induced SiC MOSFET Threshold-Voltage Instability Measurements, IEEE Transactions on Electron Devices, vol. 55, No. 8, pp. 1835-1840, Aug. 2008.

\* cited by examiner

POWER CONVERSION DEVICE

TECHNICAL FIELD

The present invention relates to a power conversion apparatus.

BACKGROUND ART

In order to suppress variation in dead time and suppress a switching loss at the time of turning on a switching element, PTL 1 discloses a drive circuit of an inverter apparatus constituted by a delay circuit including a resistance element, a capacitor, and a diode and a shunt regulator.

In order to suppress differences in voltages to be applied to switching elements even in a case where switching timings and characteristics of the switching elements or voltages caused by an external circuit are different, PTL 2 discloses a balancing circuit configured by a series circuit of a circuit for magnetically coupling a capacitor and another circuit between a collector and a gate in each of a plurality of semiconductor switching elements connected in series for each arm.

NPL 1, NPL 2, and NPL 3 disclose that a threshold voltage is changed in a case where an SiC MOSFET is continuously electrified.

CITATION LIST

Patent Literatures

PTL 1: JP-A-2005-110366
PTL 2: JP-A-2006-42512

Non Patent Literatures

NPL 1: Mrinal K. Das, "Commercially Available Cree Silicon Carbide Power Devices: Historical Success of JBS Diodes and Future Switch Prospects", CS MANTECH Conference, May 16-19, 2011, Palm Springs, Calif., USA
NPL 2: Xiao Shen, "Atomic-scale origins of bias-temperature instabilities in SiC—SiO2 structures", APPLIED PHYSICS LETTERS 98, (063507)-1-(063507)-3, 2011
NPL 3: Aivars J. Lelis, "Time Dependence of Bias-Stress-Induced SiC MOSFET Threshold-Voltage Instability Measurements", IEEE Transactions on Electron Devices, Vol. 55, No. 8, pp. 1835-1840, August 2008

SUMMARY OF INVENTION

Technical Problems

FIG. 2 of PTL 1 discloses a conventional inverter apparatus (DC/AC conversion apparatus). An inverter apparatus is an apparatus in which two sets of switching elements configured by a power device and return diodes are connected in series between a power supply on a high-voltage side (upper arm) and a power supply on a low-voltage side (lower arm). By alternately turning on/off the switching elements of the upper and lower arms, a DC level at a stage prior to an inverter circuit is converted into an AC level and is supplied to the following load circuit such as an AC isolation transformer or a motor. At this time, losses generated in the inverter are a conduction loss and a recovery loss caused by on-resistors Ron of the switching elements and the diodes or a switching loss generated by a current flowing between a drain and a source in switching operation, i.e., in a time period in which the switching elements are shifted from an on state to an off state or from the off state to the on state (a time period in which a potential difference is generated between the drain and the source).

In recent years, silicon carbide (SiC) having a band gap larger than that of silicon has attracted attention.

However, an SiC wafer used for forming an SiC element still has many defects. When a size of a chip is increased, a yield of the chips is remarkably reduced by receiving influence of the defects in the wafer.

In view of this, forming a logically single switching element by connecting a plurality of small chips in parallel is effective means to prevent reduction in the yield of the chips.

By the way, as described in NPLs 1 to 3, it is problematic in that a threshold is changed in a case where SiC MOS is continuously electrified. FIG. 11 illustrates outline of a drain-current gate-voltage characteristic obtained when a threshold is changed. FIG. 11 shows that, in a case where a positive bias is applied to a gate for a longtime, the threshold is shifted (Positive Bias Temperature Instability) by $\delta Vtp$ toward a positive side, meanwhile, in a case where a negative bias is applied to the gate for a long time, the threshold is shifted (Negative Bias Temperature Instability) by $\delta Vtn$ toward a negative side.

The inventors of the invention carried out continuous electrification operation and then measured shift amounts of thresholds of a plurality of switching elements (chips) connected in parallel. As a result, it was found that the shift amounts in the chips were largely different in some cases. This is because wiring-parasitic impedances of the switching elements connected in parallel are different and biases to be applied to the elements are transiently changed. Specifically, inverter operation is carried out in a state in which a switching element having a low threshold and a switching element having a high threshold are connected in parallel, and therefore there is a possibility that a return current in an inverter circuit unevenly flows through a certain switching element among the switching elements connected in parallel. For example, an inverter circuit (half bridge circuit) illustrated in FIG. 12 is an example where two switching elements are connected in parallel in each of upper and lower arms. In a case where ordinary switching elements having similar threshold characteristics are connected in parallel, as illustrated in FIG. 12(a), a return current of 100 A is equally divided and 50 A is returned through each of the two switching elements. Meanwhile, as illustrated in FIG. 12(b), a threshold of a switching element QU0 is significantly lower than that of a switching element QU1, almost all the return current of 100 A flows through the switching element QU0. That is, more return current flows through a switching element having a lower on-resistance.

As a method of regulating a drive timing of a switching element, there are methods disclosed in, for example, PTL 1 and PTL 2.

PTL 1 discloses a method capable of securing a so-called dead time by setting rising times and falling times of switching elements to desired values in a delay circuit in order to prevent the switching elements of the upper and lower arms from being simultaneously turned on.

PTL 2 discloses an example where a plurality of switching elements are connected in series in each of upper and lower arms. In a case where each arm in which the plurality of switching elements are connected in series is subjected to inverter circuit operation, balancing circuits each including a capacitor and a magnetic body are connected in series, and therefore voltages to be applied to the respective switching elements connected in series can be equally set.

However, the method of PTL 1 is a method of generating a dead time between the switching elements of the upper and lower arms and is not a method in which gate drive timings of respective switching elements connected in parallel are individually controlled when thresholds of the switching elements are dynamically shifted in the switching elements connected in parallel in each arm (in a plurality of S1 that are arrayed and connected). Therefore, the uneven return current described above cannot be prevented.

Also in a case where the method of PTL 2 is applied to an arm in which switching elements are connected in parallel, collectors (or drains) have a common node, and therefore a voltage difference cannot be detected. Therefore, gate drive timings of the respective switching elements connected in parallel cannot be individually controlled when thresholds of the switching elements are dynamically shifted in the switching elements connected in parallel in each arm (in a plurality of S1 that are arrayed and connected). Therefore, the uneven return current described above occurs.

As described above, in a case where the return current becomes uneven, there is a fear that a current having a value more than a rated value flows through a certain switching element, and, in that case, there is a possibility that the switching element generates heat to increase a loss of the inverter circuit.

According to the invention, a power conversion apparatus is to prevent an uneven return current at the time of inverter operation and suppress increase in a loss.

Solution to Problem

Outline of representative examples of the invention disclosed in this application will be briefly described below.

A power conversion apparatus according to this example includes: a plurality of first transistor switch groups inserted between a first power supply voltage and an output node; a second transistor switch group inserted between a second power supply voltage higher than the first power supply voltage and an output node; a first drive circuit group for controlling on/off of the first transistor switch groups; and a second drive circuit group for controlling on/off of the second transistor switch group, wherein: sense resistors for detecting a drain current are connected to the first and second transistor switch groups; the first drive circuit group and the second drive circuit group include means for monitoring a sense current flowing through the sense resistors and a plurality of delay circuits. Rising times of the plurality of transistor switch groups are controlled by controlling activation and non-activation of the plurality of delay circuits on the basis of a magnitude of the sense current.

Advantageous Effects of Invention

According to the invention, it is possible to prevent uneven return current at the time of inverter operation and suppress increase in a loss.

DESCRIPTION OF EMBODIMENTS

Hereinafter, in Examples, although a MOSFET (Metal Oxide Semiconductor Field Effect Transistor) (abbreviated as "MOS transistor") is used as an example of a MISFET (Metal Insulator Semiconductor Field Effect Transistor), a non-oxide film is not removed as a gate insulating film. In drawings, a p-channel type MOS transistor (PMOS transistor) and an n-channel type MOS transistor (NMOS transistor) are distinguished by putting a circle mark on a gate of the p-channel type MOS transistor.

Example 1

Hereinafter, a semiconductor drive circuit and a power conversion apparatus of Example 1 will be described with reference to FIG. 1 to FIG. 4.

Figure 1:
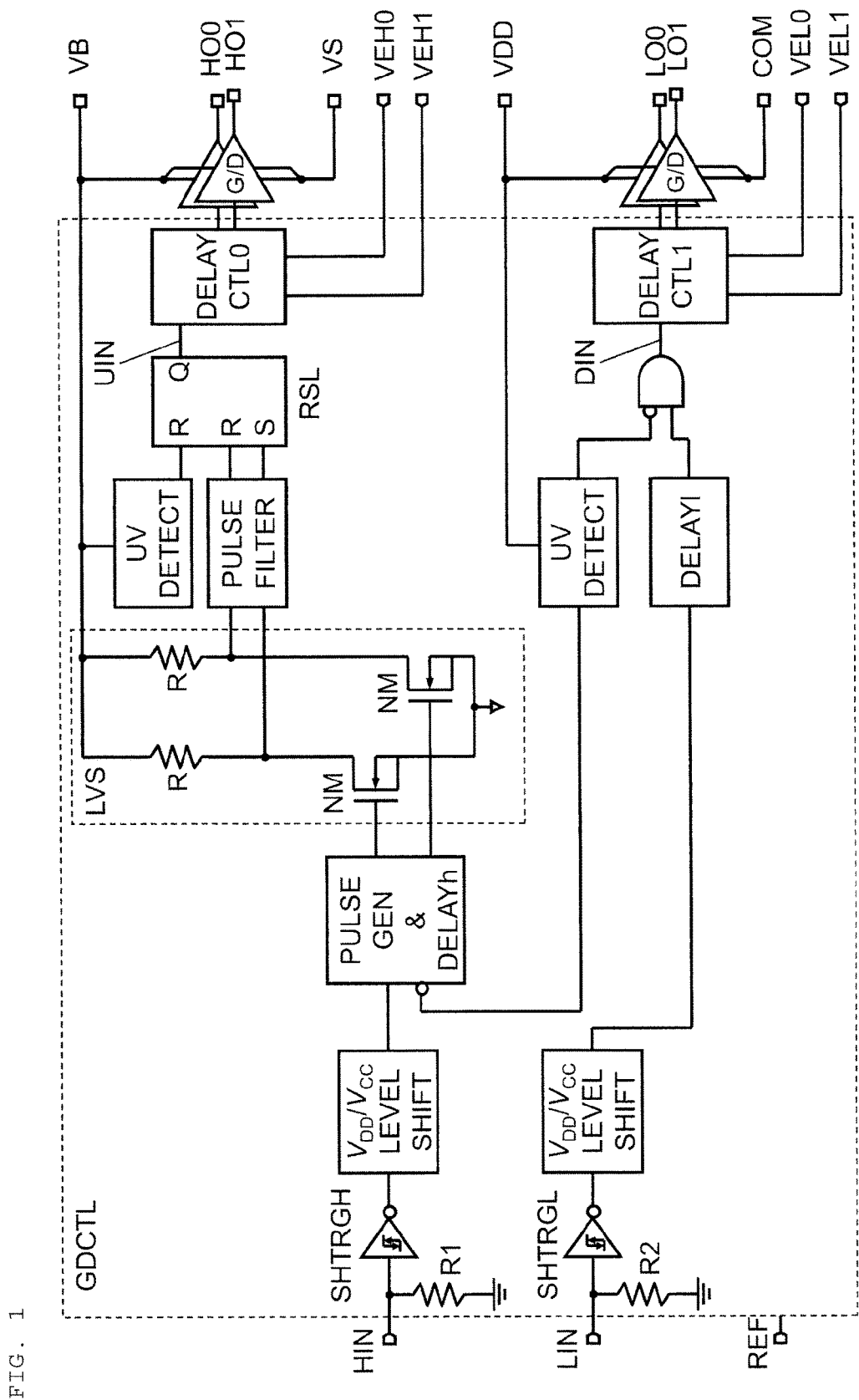
FIG. 1 is an example illustrating a gate drive control circuit of Example 1.

FIG. 1 illustrates a gate drive control circuit GDCTL and a gate drive circuit G/D in Example 1. Symbols in FIG. 1 are the gate driver control circuit GDCTL, an H-side input signal HIN, an L-side input signal LIN, a level shift circuit LEVEL SHIFT, a pulse generating circuit PULSE GEN&DELAYh, a pulse filter PULSE FILTER, a delay circuit DELAY1, a power supply voltage reduction protection circuit UV DETECT FILTER, a latch circuit RS LATCH, the gate drive circuit G/D, resistors R1, R2, an NMOS transistor NM, power supply voltages VDD and VCC, a high-voltage side power supply level VB, a high-voltage side source level VS, a low-voltage side power supply level VCC, a low-voltage side source level COM, high-voltage side sense signals VEH0, VEH1, low-voltage side sense signals VEL0, VEL1, upper-arm switch control signals HO0 and HO1, and lower-arm switch control signals LO0 and LO1.

In FIG. 1, in a case where a high-side input signal HIN (or low-side input signal LIN) is asserted, a voltage level is shifted by the level shift circuit LEVEL SHIFT via a Schmitt trigger circuit SHTRGH (or SHTRGL).

The Schmitt trigger circuit SHTRGH (or SHTRGL) is and the resistors R1 and R2 are a circuit for transferring a stable output level to the level shift circuit LEVEL SHIFT even in a case where HIN and LIN are changed. Note that the level shift circuit shifts output levels of HIN and LIN to a level of the power supply voltage VDD (e.g., 15 V).

The one-shot pulse generating circuit PULSEGEN receives output of the level shift circuit LEVELSHIFT and generates a one-shot pulse signal at both rising and falling of the output of the level shift circuit LEVELSHIFT.

A level shift circuit LVS includes NMOS transistors NM and resistors R. The NMOS transistor NM shifts a high output level of the one-shot pulse signal (for rising) to a level of the high potential VB and shifts a high output level of the one-shot pulse signal (for falling) to the level of the high potential VB. The high potential VB is set to a voltage (VS+15 V) by adding the source voltage VS of the gate drive circuit G/D in FIG. 1 to, for example, 15 V, and becomes a high-potential side power supply voltage of the gate drive circuit G/D.

An output signal of the level shift circuit LVS is inputted to the RS latch circuit RSL via the pulse filter PULSEFILTER. For example, the one-shot pulse signal (for rising) from the level shift circuit LVS is set input to the RS latch circuit RSL and the one-shot pulse signal (for falling) from the level shift circuit LVS is reset input to the RS latch circuit RSL. At this time, the pulse filter PULSEFILTER removes an indeterminate signal other than a predetermined control signal.

A delay time control circuit DELAYCTL0 (or DELAYCTL1) operates in response to an output signal UIN (or DIN) of the RS latch circuit RSL as input and transfers output signals thereof to the gate drive circuits G/D for the upper arm (or lower arm).

The gate drive circuits G/D operate in response to the output signals of the delay time control circuit DELAYCTL0 (or DELAYCTL1) as input and output the upper-arm switch control signals HO0, HO1 (or lower-arm switch control signals LO0, LO1).

A voltage detection protection circuit UVDETECT monitors the high potential VD (or VDD) and carries out reset input with respect to the RS latch circuit RSL when the high potential VS (or VDD) is decreased, thereby protecting switching elements via the gate drive circuits G/D and the like.

The delay circuits DELAYh and DELAY1 delay an output signal of the level shift circuit LEVELSHIFT and transfer the output signal to the following circuit. The delay circuits DELAYh and DELAY1 generate a so-called dead time for preventing the switching elements of the upper and lower arms from being simultaneously turned on. Note that circuit configurations of the delay circuits DELAYh and DELAY1 are not particularly limited. For example, the delay circuits DELAYh and DELAY1 may be configured by plural stages of CMOS inverting circuits and the like.

Figure 2:
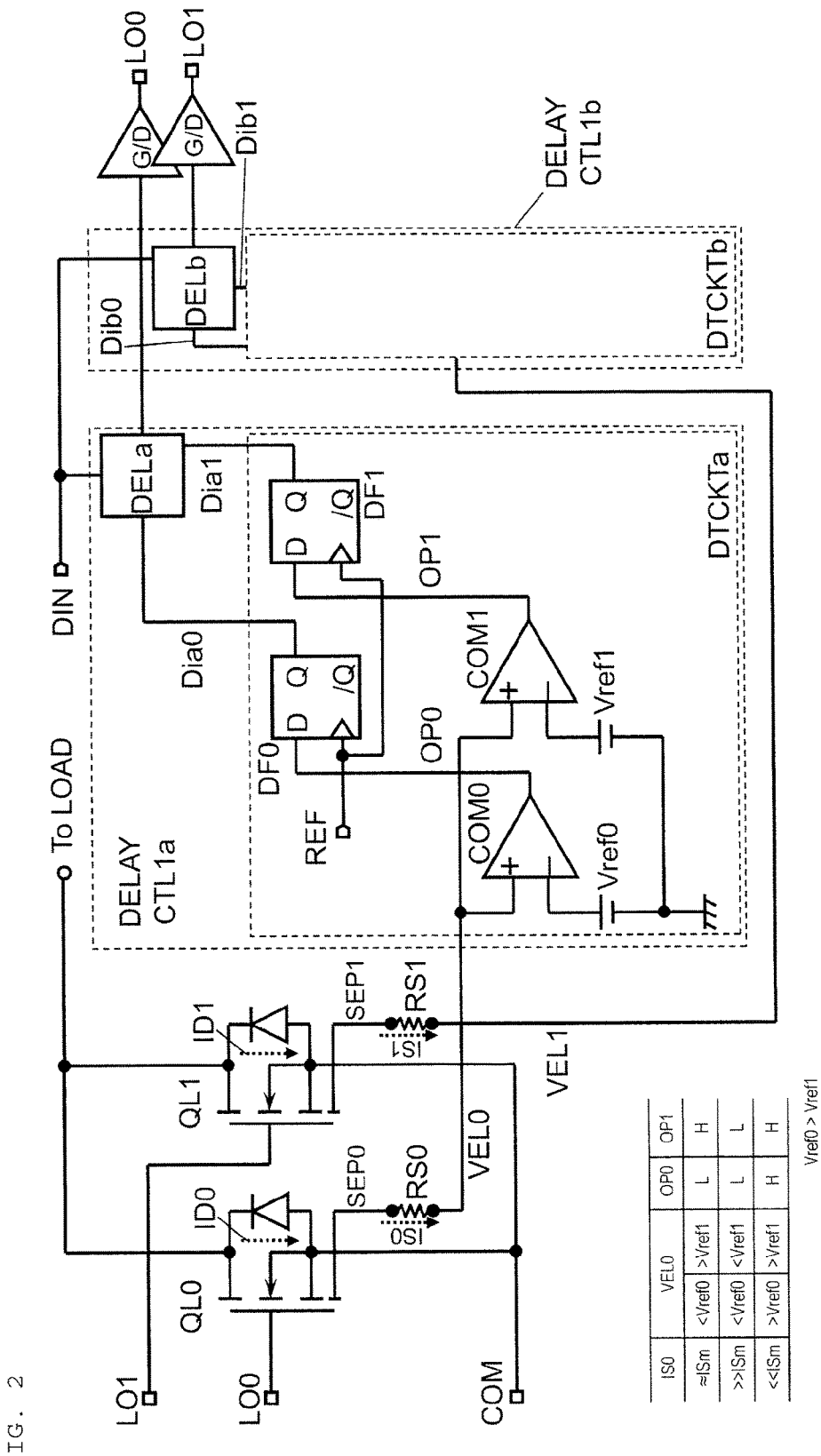
FIG. 2 is an example illustrating a part of the gate drive control circuit illustrated in FIG. 1 and a main part of a power conversion apparatus.

FIG. 2 is a view illustrating the delay control circuit DELAYCTL1 (or DELAYCTL0) and delay circuits DELa, DELb configuring the gate drive control circuit GDCTL of FIG. 1 two switching elements that are connected in parallel and configure the lower arm, and the gate drive circuits G/D thereof. In FIG. 2, for the sake of easy explanation, an operation method of the delay control circuit DELAYCTL1 of the lower arm will be described.

FIG. 2 illustrates QL0, QL1 that are two switching elements configuring the lower arm, ID0, ID1 that are drain currents flowing through the respective switching elements, SEP0, SEP1 that are sense nodes of the respective switching elements, the low-voltage side source level COM, sense resistors RS0, RS1, reference power supplies Vref0, Vref1, comparators COM0, COM1, the low-voltage side sense signals VEL0, VEL1, comparator output signals OP0, OP1, flip-flop circuits DF0, DF1, flip-flop output signals Dia0, Dia1, Dib0, Dib1, a detection activation signal REF, and DTCKTa, DTCKTb that are detection circuits.

Figure 3:
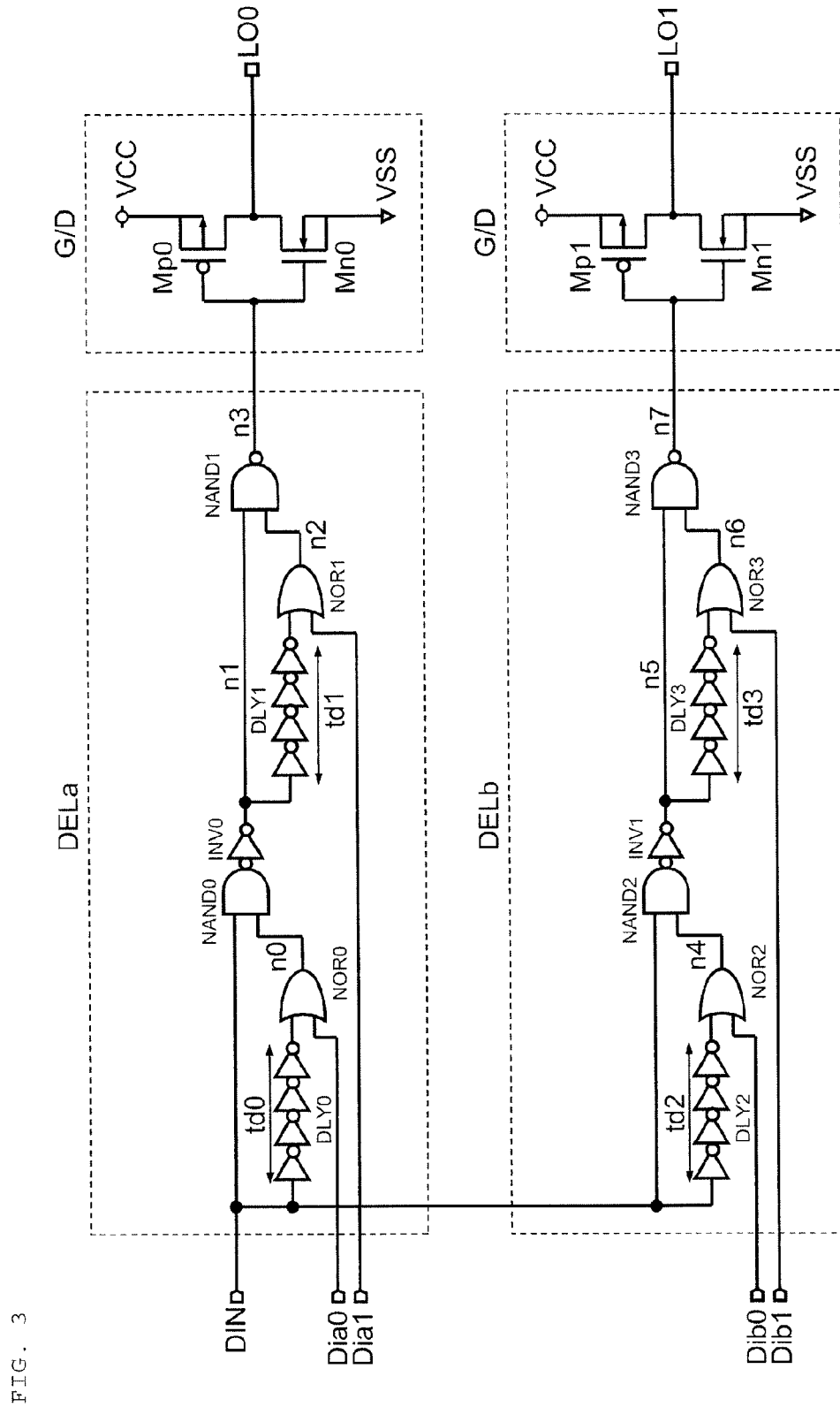
FIG. 3 is an example illustrating a delay circuit and a gate drive circuit illustrated in FIG. 2.

FIG. 3 is a view illustrating a circuit configuration of the delay circuits DELa, DELb and the gate drive circuits illustrated in FIG. 2. FIG. 3 illustrates OR circuits NOR0, NOR1, NOR2, NOR3, AND circuits NAND0, NAND1, NAND2, NAND3, inverting circuits INV0, INV1, delay elements DLY0, DLY1, DLY2, DLY3, NMOS transistors MN0, MN1 and PMOS transistors Mp0, Mp1 configuring the gate drive circuits G/D, and nodes n0, n1, n2, n3, n4, n5, n6, n7.

Operation of FIG. 2 and FIG. 3 will be described by using a timing waveform of FIG. 4.

Figure 4:
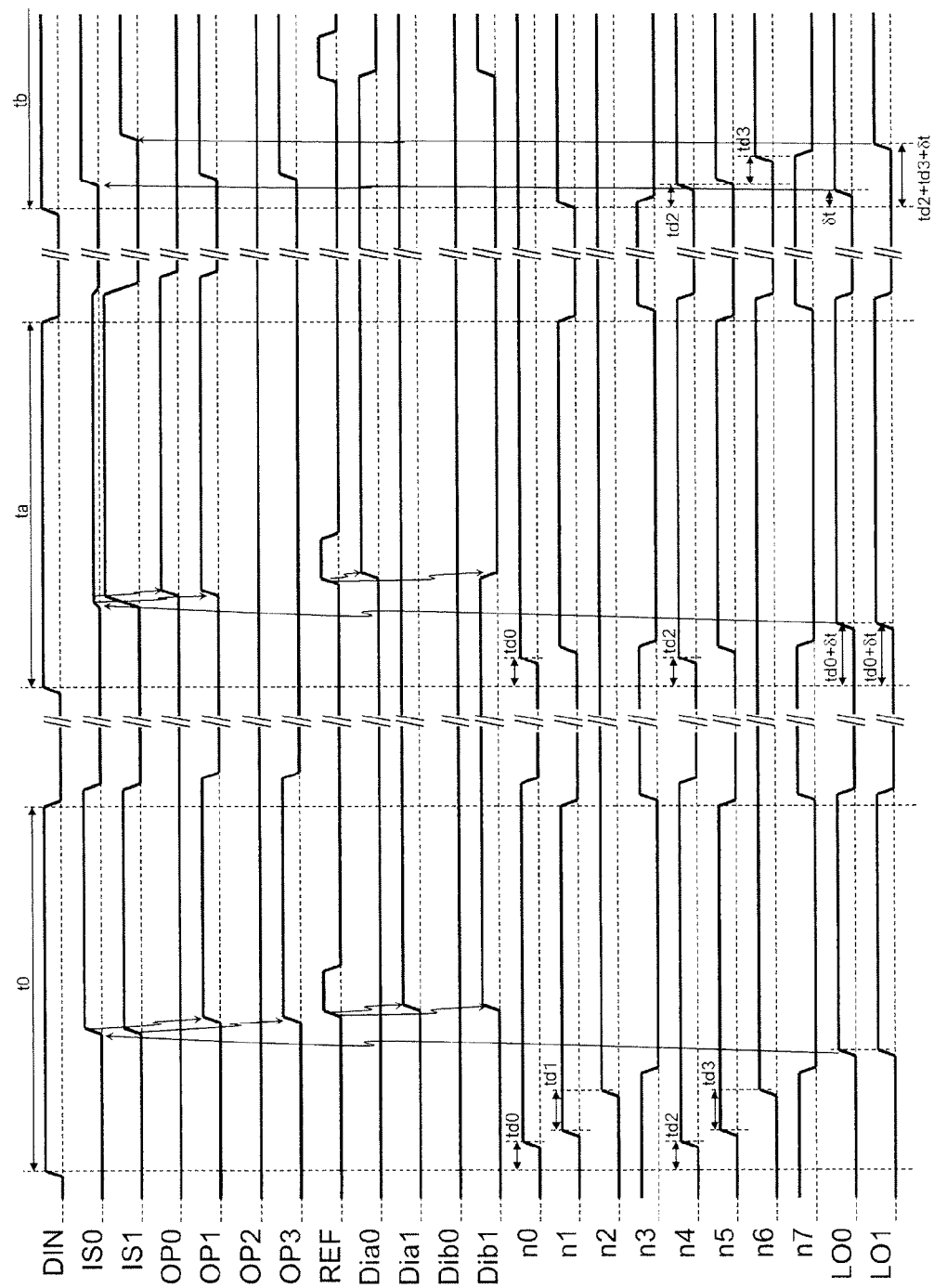
FIG. 4 is an example illustrating operation timings of the circuits illustrated in FIG. 1, FIG. 2, and FIG. 3.

In a case where, in an initial operation time period of a time period t0 in FIG. 4, a low-side input signal LIN is asserted and then a high output signal DIN is driven, the comparator output signals OP0 to OP3 and the flip-flop output signals Dia0, Dia1, Dib0, Dib1 have initial values of zero, and therefore the nodes n0 to n7 in FIG. 3 follow the output signal DIN and are asserted to respective potentials. The nodes n0 and n4 are asserted from a low level to a high level with a delay of a predetermined time td0 set at the delay element DLY0 or a predetermined time td2 set at the delay element DLY1 from an assertion timing of the output signal DIN.

The nodes n1 and n5 are asserted from a low level to a high level with a delay of an operation time of the AND circuit NAND0 and the AND circuit NAND2 and the inverting circuit INV0 and the inverting circuit INV1.

Similarly, the node n2 and the node n6 are asserted from a low level to a high level with a delay of predetermined times td1, td3 which are set at the delay element DLY1, the delay element DLY3. The node n3 and the node n7 are asserted from a high level to a low level with a delay of operation times of the AND circuit NAND1 and the AND circuit NAND3, respectively. As a result, the lower-arm switch control signals LO0, LO1 are asserted to a high level and thus the switching elements QL0, QL1 are shifted from an off state to an on state. In the time period t0, characteristics (e.g., threshold) of the switching elements QL0, QL1 that are SiC MOSFETs have substantially same values, and therefore the drain currents ID0, ID1 having the same values flow through the respective switching elements. Sense currents flowing through the sense nodes SEP0, SEP1 also have the same values, and therefore voltages that have been converted in the sense resistors RS0, RS1 are inputted as the low-voltage side sense signals VEL0, VEL1 to the comparators COM0, COM1, respectively. Herein, in a case where sense currents IS0 and IS1 have substantially same values (~ISm), levels of the sense resistor RS0 and the reference power supplies Vref0, Vref1 may be set so that the low-voltage side sense signal VEL0 has a relation of the reference power supplies Vref1<VEL0<Vref0. In a case of the sense current IS0>>Ism, the levels may be set so that the low-voltage side signal VEL0 has a relation of VEL0< the reference power supplies Vref1<Vref0, meanwhile, in a case of the sense current IS0<<Ism, the levels may be set so that the low-voltage side signal VEL0 has a relation of the reference power supplies Vref1<Vref0<VEL0. By performing setting as described above, output levels of the comparator output signals OP0, OP1 can be controlled to be (OP0, OP1)=(L, H) (IS0≈ISm), (OP0, OP1)=(L, L) (IS0>>ISm), and (OP0, OP1)=(H, H) (IS0<<ISm), as in the table shown in FIG. 2. For example, the sense currents IS0 and IS1 are substantially equal in the time period to, and therefore the comparator output signals OP0, OP1 (or OP2, OP3) are asserted to L, H levels, respectively. Next, in a case where the detection activation signal REF is asserted, the flip-flop circuits DF0, DF1 are activated, and therefore the output signals Dia0, Dia1 (or output signals Dib0, Dib1) thereof are asserted to predetermined levels, respectively. Note that, because the flip-flop output signals are inputted to the OR circuits NOR, potentials of the nodes n0 to n7 in the delay circuits are controlled so as not to be changed in a time period in which the low-side output signal DIN is asserted to be high.

Thereafter, in a case where the low-side output signal DIN is negated to be low, the switching elements QL0, QL1 are shifted from the on state to the off state, and therefore the sense currents IS0, IS1 do not flow. Thus, the comparator output signals OP0, OP1 (or OP2, OP3) are negated to be a low level. Meanwhile, the flip-flop output signals retain potential levels because the detection activation signal is negated. By negating the low-side output signal, the nodes n0 to n7 in the delay circuits are shifted to predetermined levels accordingly.

A time period to after electrification for a long time will be described below. Herein, it is assumed that a threshold of the switching element QL0 becomes higher than a threshold of the switching element QL1 because a condition of a bias applied at the time of switching differs every time when the switching is carried out because of, for example, a difference between wiring-parasitic impedances in the switching elements QL0, QL1 connected in parallel. First, in a case where the low-side output signal DIN is asserted, the nodes n2 and n6 in the respective delay circuits DELa and DELb are asserted to be high in the time period t0, and therefore the delay elements DLY1 and DLY3 are not activated. Thus, the nodes n3 and n7 are asserted to be a low level. That is, the lower-arm switch control signals LO0, LO1 are asserted to be high with a delay of the delay times td0, td2 of the delay elements DLY0, DLY2. As a result, the switching elements QL0, QL1 are shifted from the off state to the on state. At this time, the threshold of the switching element QL0 is shifted more highly than the threshold of the switching element QL1, and therefore the return current is distributed to the switching elements in a state of the sense currents IS0<<Ism<<IS1. However, by using the method of this example, both the comparator output signals OP0, OP1 are asserted to be a high level, and both the comparator output signals OP2, OP3 are negated to be a low level. Then, in a case where the detection activation signal REF is asserted, both the flip-flop output signals Dia0, Dia1 are asserted to be a high level, and both Dib0, Dib1 are asserted to be a low level. In this way, it is possible to change rising timings of the switching elements QL0, QL1 when a next low-side output signal DIN is asserted.

A case where the low-side output signal DIN is asserted again in a time period tb will be described. In this case, because both the flip-flop output signals Dia0, Dia1 are retained at the high level, the delay elements DLY0, DLY1 are not activated. Therefore, immediately after assertion of DIN, the lower-arm switch control signal LO0 is asserted to be high. Meanwhile, because both the flip-flop output signals Dib0, Dib1 are retained at the low level, the delay elements DLY2, DLY3 are activated. Therefore, the lower-arm switch control signal LO1 is asserted to be high with a delay of the delay time td2+td3 from the assertion of the low-side output signal DIN. As a result, the switching element QL0 is shifted to the on state earlier than the switching element QL1 by the time of approximately td2+td3, and therefore, even in a case where the threshold of the switching element QL0 becomes higher than the threshold of the switching element QL1, the return current first flows into the switching element QL0, and then the switching element QL1 is shifted to the on state after a predetermined time. Thus, the return current of the inverter circuit can be controlled so as to be equally divided by the switching element QL0 and the switching element QL1. By performing control as described above, even in a case where the characteristics of the switching elements connected in parallel after the electrification for a long time are different, it is possible to prevent the return current from unevenly flowing through a certain switching element. In other words, it is possible to prevent an excessive current from flowing into a certain switching element of the plurality of switching elements connected in parallel because of an uneven return current and to prevent generation of heat in the certain switching element as a result of flowing of the excessive current and increase in a loss of the power conversion apparatus including the inverter circuit.

Example 2

Figure 5:
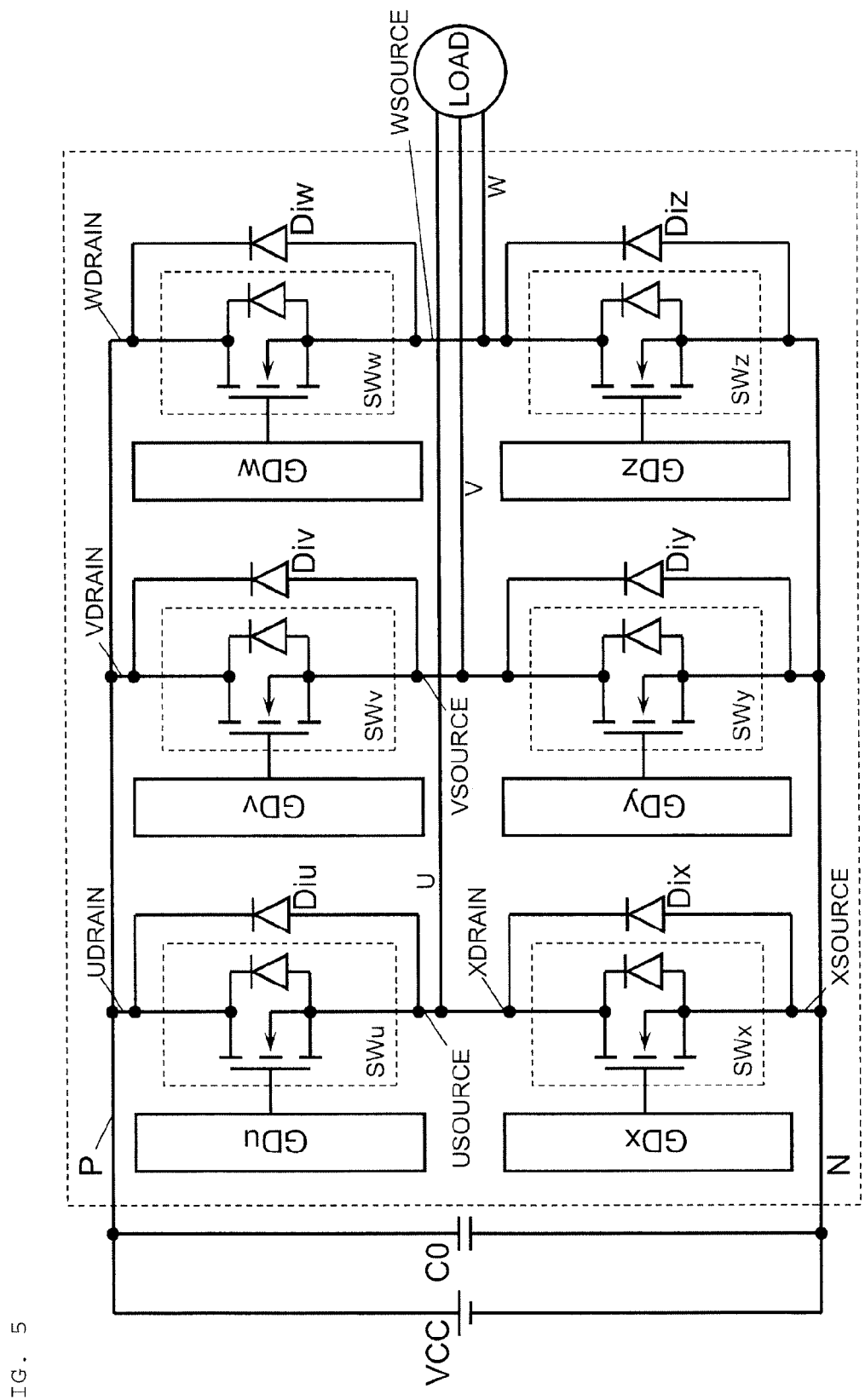
FIG. 5 is a view in which switching elements illustrated in FIG. 2 are applied to a three-phase inverter.

FIG. 5 is a schematic view illustrating an example of a configuration of a power conversion apparatus according to Example 2. The power conversion apparatus illustrated in FIG. 5 is an apparatus in which, for example, the method of Example 1 is applied to a so-called three-phase inverter apparatus. In FIG. 5, SWu, SWv, SWw, SWx, SWy, SWz are switching elements made of n-channel type SiC MOS, and, herein, each of return diodes Diu, Div, Diw, Dix, Diy, Diz is connected between a source and a drain of the corresponding switching element. The switching elements SWu, SWv, SWw are provided on an upper-arm side, and the switching elements SWx, SWy, SWz are provided on a lower-arm side. The switching elements SWu, SWx are for a U-phase, the switching elements SWv, SWy are for a V-phase, and the switching elements SWw, SWz are for a W-phase.

GDu, GDv, GDw, GDx, GDy, GDz are gate drive circuits illustrated in FIG. 1 and drive the switching elements SWu, SWv, SWw, SWx, SWy, SWz, respectively. Note that, although not illustrated in FIG. 1, the gate drive control circuit illustrated in FIG. 1 is added to each of the gate drive circuits. The power supply voltage VCC and the capacitor C0 are connected between an end (drain node) of the upper-arm side switching elements and an end (source node) of the lower-arm side switching elements. Each of the gate drive circuits appropriately drives on/off of the corresponding switching element, and, by this driving, generates an altering current signal having three phases (U phase, V phase, W phase) from VCC that is a direct current signal. LOAD is, for example, a load circuit such as a motor and is appropriately controlled by this altering current signal having the three phases (U phase, V phase, W phase).

Herein, detailed operation of each of the U phase, the V phase, and the W phase at the time of hard switching operation is similar to FIG. 4 or the like. In the three-phase inverter apparatus, the upper-arm side switching element (e.g., SWu) is shifted to an on state in a state in which the lower-arm side switching element (e.g., SWx) is in an off state. At this time, in a case where each of the switching elements SWu, SWx is configured by connecting a plurality of switching elements in parallel, there is a possibility that the characteristics of the switching elements, for example, thresholds are shifted to different values, as described above. In this case, there is a fear that a return current of the three-phase inverter unevenly flows through a certain switching element, which may cause increase in a loss caused by generation of heat or the like. However, the gate drive control circuits and the gate drive circuits according to this example can detect a magnitude of a sense current flowing through the switching elements and appropriately control a rising time of each switching element.

With this, also in a case where shift amounts of threshold voltages of the switching elements are different in the three-phase inverter apparatus that has been subjected to electrification operation for a long time, it is possible to control a return current so that the return current is equally divided by the switching elements, without unevenly flowing. In other words, it is possible to achieve highly reliable and stable power conversion operation. In particular, because such a three-phase inverter apparatus is operated with high power in many cases, generation of heat caused by an uneven current may become large, and damage caused when a loss is increased due to the generation of heat may become large. In view of this, by using the method of this example, a low loss can be achieved by using SiC MOS also at the time of operation with high power, and the increase in the loss can be suppressed. Therefore, a beneficial effect can be obtained.

Figure 6:
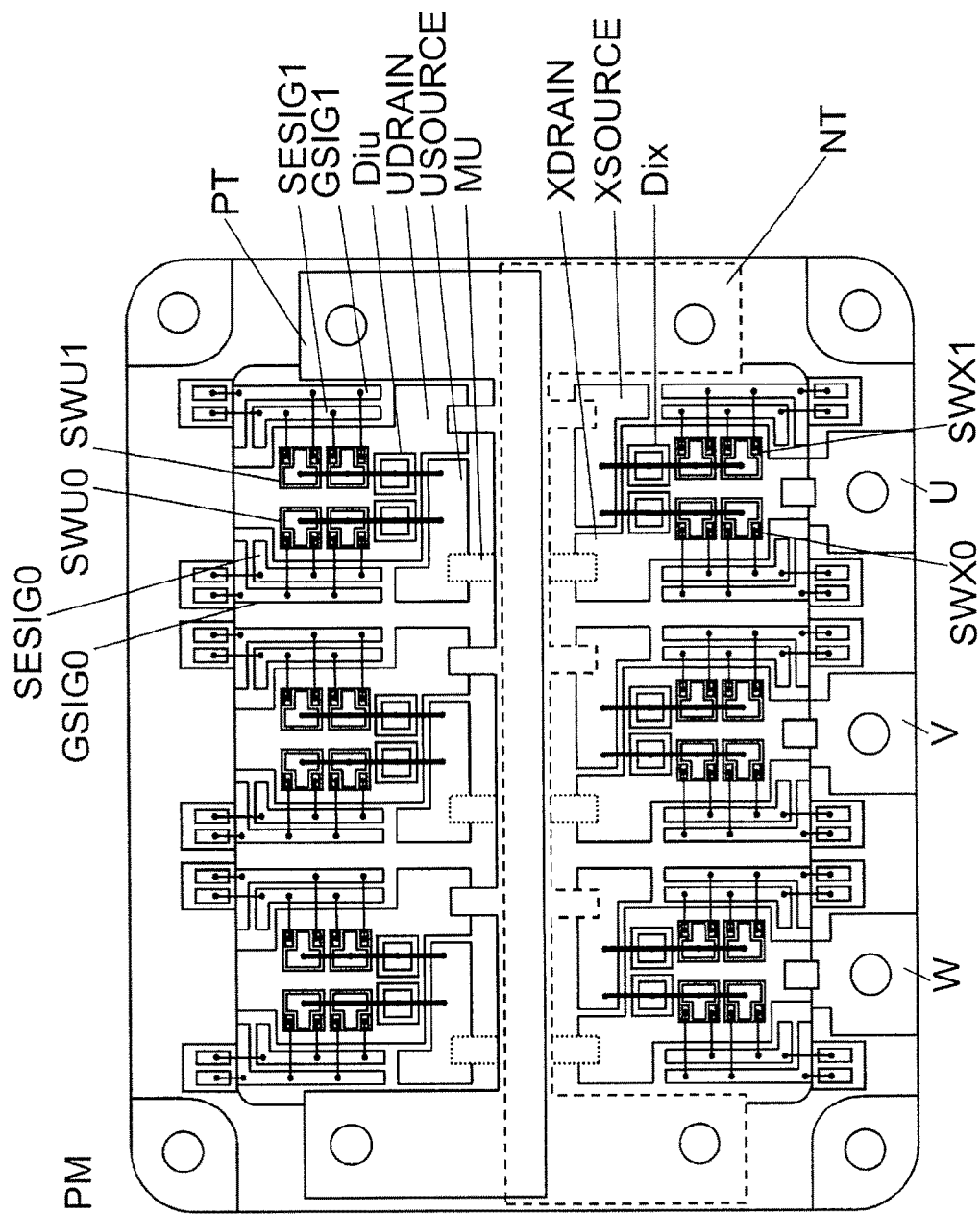
FIG. 6 is an example where the three-phase inverter illustrated in FIG. 5 is mounted on a power module.

FIG. 6 illustrates an example of a power module PM on which the three-phase inverter apparatus of FIG. 5 is mounted. Symbols in FIG. 6 illustrates a positive-side connection terminal PT, a negative-side connection terminal NT, U-phase upper-arm switch groups SWU0, SWU1, U-phase lower-arm switch groups SWX0, SWX1, a U-phase upper-arm return diode Diu, a U-phase lower-arm return diode Dix, an upper-arm drain UDRAIN, an upper-arm source USOURCE, a lower-arm drain XDRAIN, a lower-arm source XSOURCE, a connection terminal MU, gate control terminals GSIG0, GSIG1, sense control terminals SESIG0, SESIG1, a U-phase output terminal U, a V-phase output terminal V, and a W-phase output terminal W. Note that the symbols for explaining elements and terminals regarding the V phase and the W phase are the same as those of the structure of the U phase, and therefore description thereof is omitted to prevent the drawings from being complicated. Regarding the symbols of FIG. 6 and the symbols of FIG. 5, the same members are denoted by the same symbols.

An example of FIG. 6 is a configuration in which four switching elements of the upper and lower arms are connected in parallel. FIG. 6 illustrates an example where the four switching elements are divided into two parts each including two switching elements. Therefore, the two gate control terminals and the two sense control terminals are provided in a U-phase upper arm and the two gate control terminals and the two sense control terminals are provided in a U-phase lower arm. Providing a single control terminal for two switching elements or providing a single control terminal for a single switching element may be appropriately selected depending on an embodiment thereof. For example, in a case of FIG. 6, because the three-phase inverter apparatus is mounted on the general power module PM, the configuration illustrated in FIG. 6 is employed considering that, when many control terminals are provided, the number of wires from a drive circuit board is increased to increase a system mounting area and, by providing four switching elements symmetrically two by two and providing control terminals, respectively, differences between wiring-parasitic impedances can be suppressed to be relatively small. As a matter of course, even in a case where the number of switching elements of the U-phase upper arm is eight, dividing the eight switching elements into four parts and controlling the switching elements or dividing the eight switching elements into eight parts and controlling the switching elements may be optimally selected depending on an embodiment thereof. As described above, Example 2 can suppress increase in an area of the power module PM as much as possible, can appropriately regulate drive timings of the plurality of the switching elements, and can suppress the increase in the loss of the power conversion circuit.

Example 3

Figure 7:
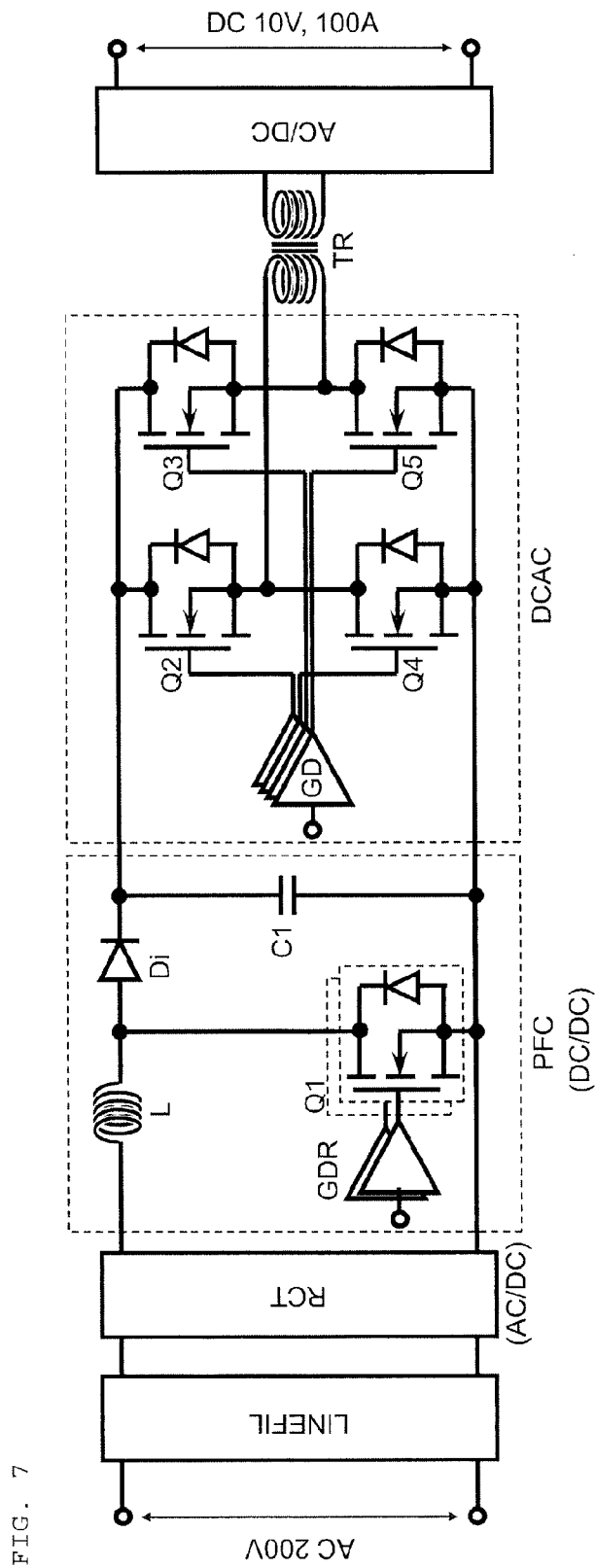
FIG. 7 is an example where a semiconductor drive circuit and a power conversion apparatus are applied to a power supply circuit.

FIG. 7 is a schematic view illustrating an example of a configuration of a power conversion apparatus according to Example 3. The power conversion apparatus illustrated in FIG. 7 is an apparatus in which, for example, the method of Example 1 is applied to an AC/DC power supply apparatus. The power conversion apparatus of FIG. 7 removes a noise of altering current input (e.g., AC 200 V) with the use of a line filter LINFIL and converts (AC/DC) an AC voltage into a DC voltage via a rectifier circuit (e.g., diode bridge and output capacitor) RCT. Then, a DC level is boosted to, for example, about 400 V by a booster circuit PFC. Symbols in FIG. 7 are a coil L, a chopper diode Di, two main switching elements Q1 (in parallel), main switch drive circuits GDR, and a stabilizing capacitor C1. Note that a control method of the booster circuit PFC is a general control method, and therefore description thereof is herein omitted.

Subsequently, the power conversion apparatus of FIG. 7 converts the DC level of about 400 V from the booster circuit PFC into an AC level in an inverter apparatus DCAC, and carries out AC/AC conversion (e.g., AC 400 V→AC 10 V) in a transformer TR. Then, an AC signal obtained from a secondary-coil side of TR is converted into, for example, DC 10 V, DC 100 A, or the like in an AC/DC conversion circuit ACDC and is then outputted. Herein, the inverter apparatus DCAC is configured by a so-called full-bridge circuit including, for example, four switching elements Q2, Q3, Q4, Q5 and gate drive circuits GD thereof. Note that, although not illustrated in particular in FIG. 7, a plurality of chips are connected in parallel in each of the switching elements Q2 to Q5. In such a configuration example, by applying the method of this example described above to the DCAC, it is possible to achieve highly reliable power supply apparatus having a low loss.

Example 4

Figure 8:
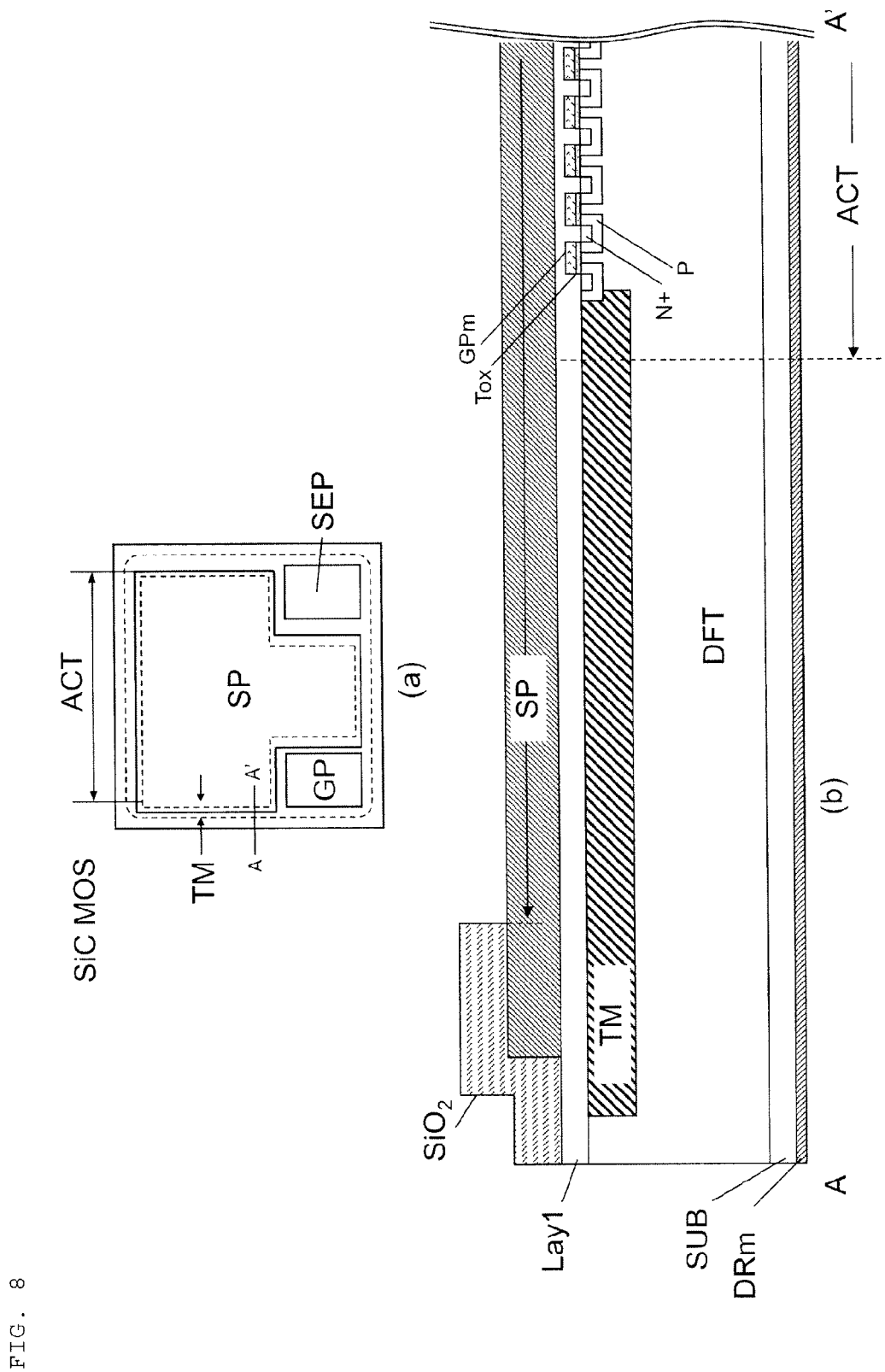
FIG. 8 is an example illustrating a planar layout and a cross-sectional structure of the switching element used in FIG. 2.

FIG. 8(a) is a plan view illustrating a schematic configuration example of a switching element of a power conversion apparatus according to Example 4, and FIG. 8(b) is a cross-sectional view illustrating a schematic configuration example taken along lines A-A' in FIG. 8(a). A switching element SW of FIG. 8(a) is made of SiC MOS. In FIG. 8(a), ACT is an active element region, TM is a termination region, and GP is a gate pad, and SP is a source pad. In FIG. 8(a), the gate pad GP can be freely positioned, and therefore a length of wire bonding can be shortened in a case where the switching element is applied to an embodiment illustrated in FIG. 10(a) described below.

In FIG. 8(b), in addition to the symbols of FIG. 8(a), DRm is a drain electrode, SUB is a substrate, DFT is a drift layer, $SiO_2$ is a silicon oxide film, Tox is a gate insulating film, GPm is a gate electrode, P is a base layer, N+ is a source layer, and LAY1 is an interlayer insulating film. A single switching element is formed by providing a plurality of element transistors made of SiC MOS in ACT and connecting the element transistors in parallel. That is, the plurality of N+ are connected in common to the source pad in a region (not shown), and the plurality of GPm are also connected in common to the gate pad GP in FIG. 8(a) in a region (not shown). In FIG. 8(b), by providing the termination region TM around the active element region ACT, it is advantageous in that ACT can be satisfactorily secured in a chip and an on-state current can be large, i.e., an on-resistance can be reduced.

Figure 9:
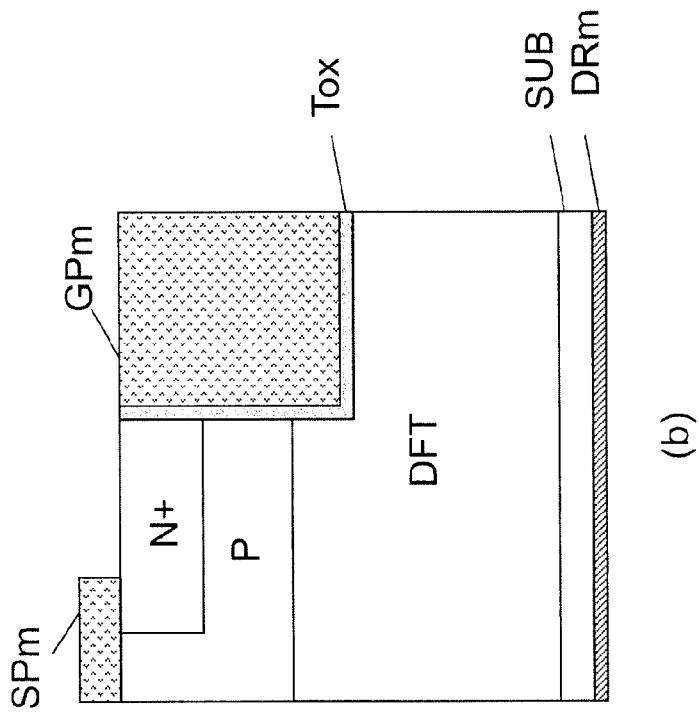
FIG. 9 is an example illustrating a cross-sectional structure of an SiC MOSFET used in FIG. 2.
Figure 9:
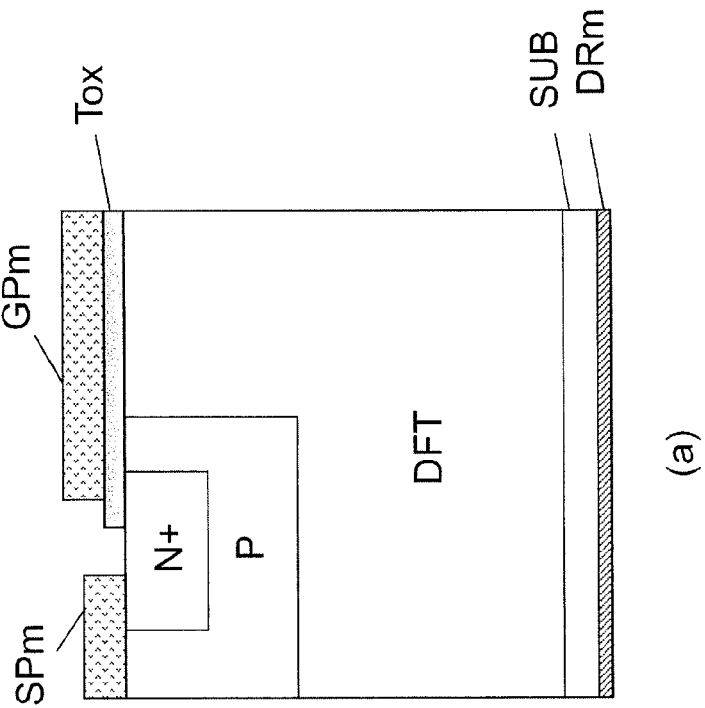

FIG. 9(a) is a cross-sectional view illustrating a configuration example of each element transistor in the active element region of FIG. 8(b), and FIG. 9(b) is a cross-sectional view illustrating a configuration example different from that of FIG. 9(a). FIG. 9(b) illustrates a single vertical SiC MOS having a trench structure. The source layer N+ serving as an $n^+$-type region connected to a source electrode SPm is connected to the drift layer DFT via a channel formed in the base layer P serving as a p-type region. DFT is, for example, an $n^-$-type region and secures a pressure resistance. The substrate SUB is, for example, an $n^+$-type region and the drain electrode DRm is connected to the SUB.

In a case of such a trench structure, because a so-called JFET region serving as an n-type semiconductor region sandwiched between the base layer P does not exist, it is advantageous in that the on-resistance of the whole SiC MOS can be reduced. In other words, a power conversion system having a less loss can be achieved by using SiC MOS in combination with the semiconductor drive circuit (gate drive circuit and gate driver control circuit) according to this example. Meanwhile, FIG. 9(a) illustrates a so-called DMOS (Double Diffusion Metal Oxide Semiconductor) type SiC MOS that does not have the trench structure. In this case, an element structure is simple, and therefore it is advantageous in that a production cost can be reduced in comparison with the trench structure type SiC MOS.

Figure 10:
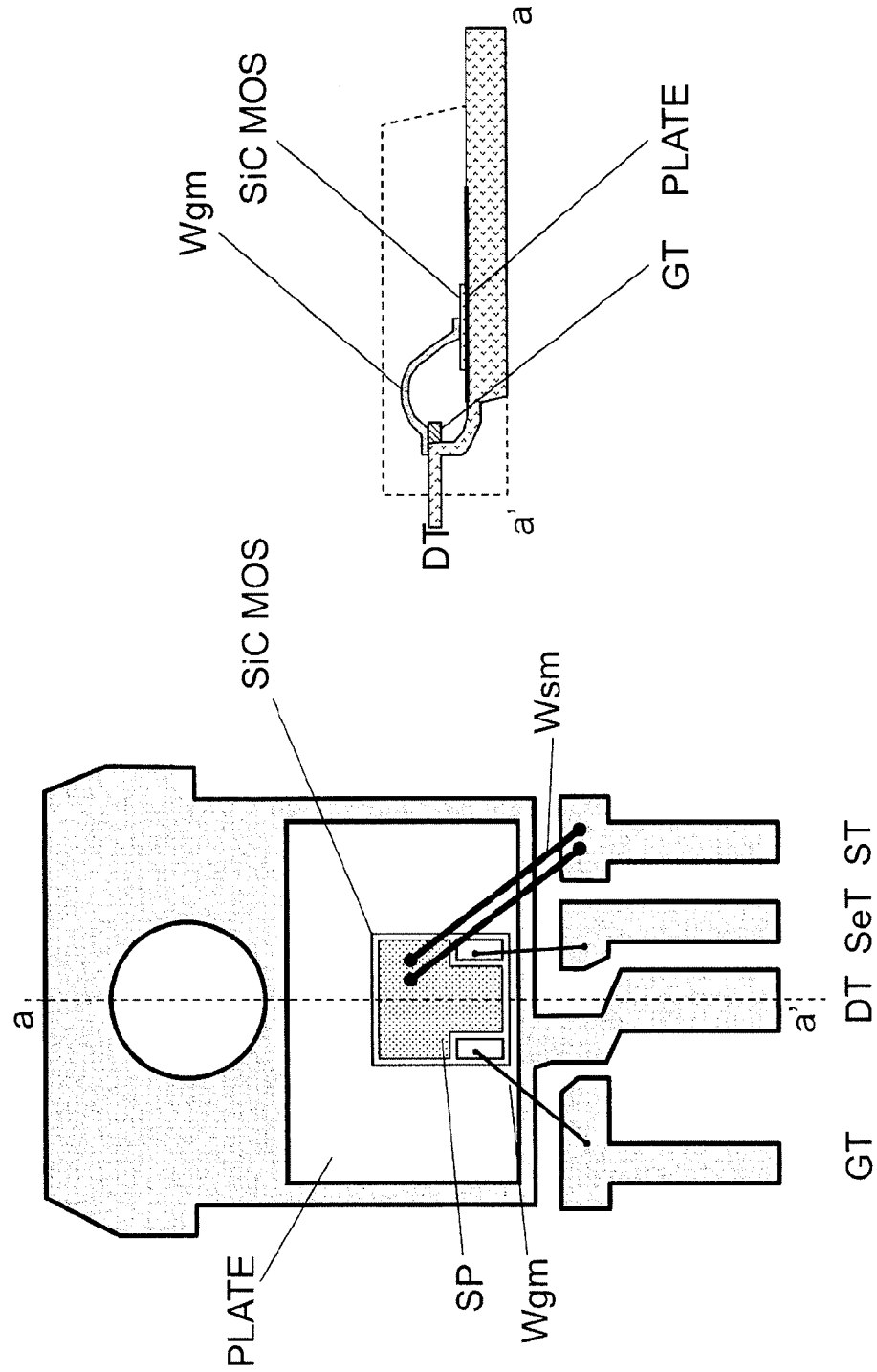
FIG. 10 is an example where the switching element illustrated in FIG. 2 is mounted on a package.
Figure 11:
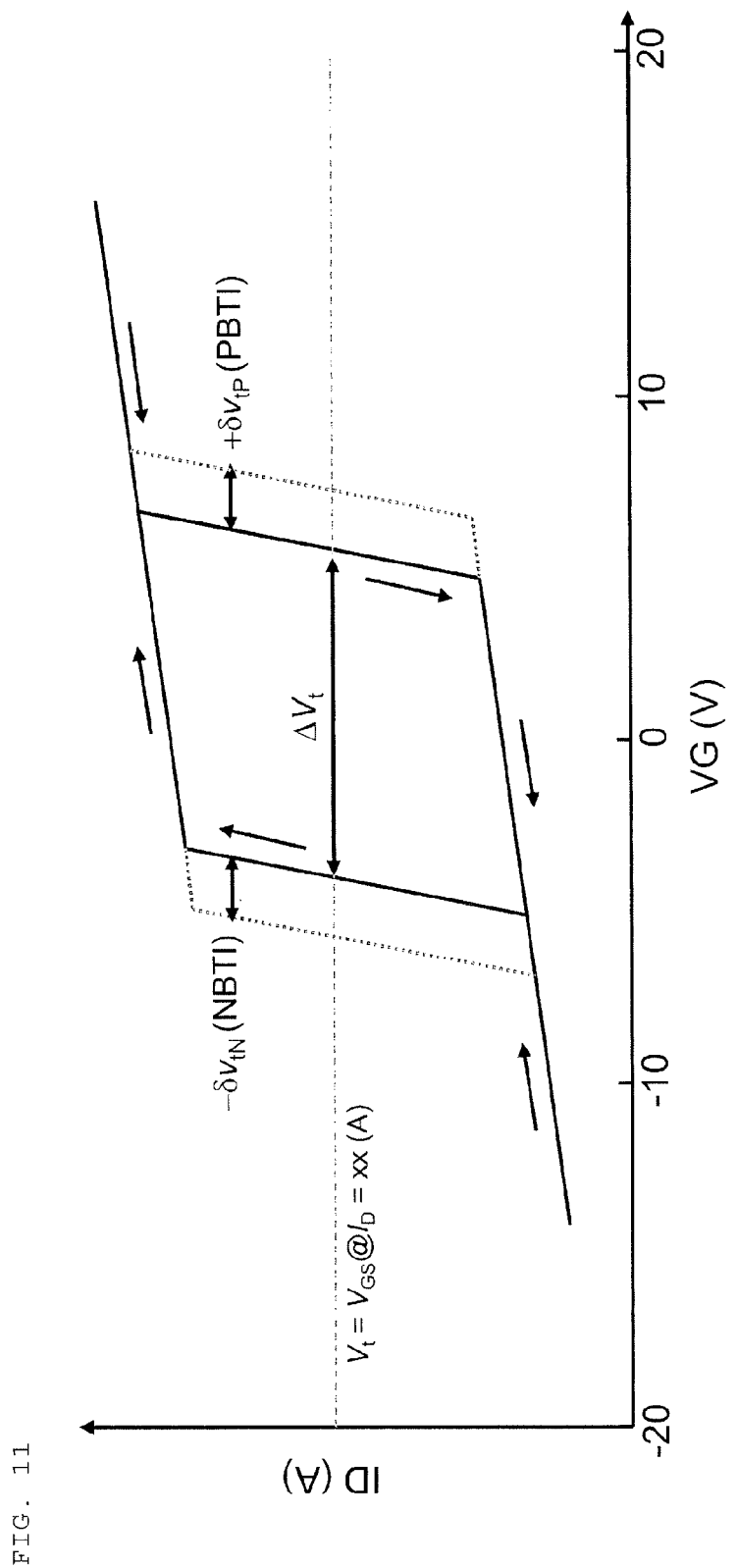
FIG. 11 is an explanatory view illustrating a characteristic example of an SiC MOSFET.
Figure 12:
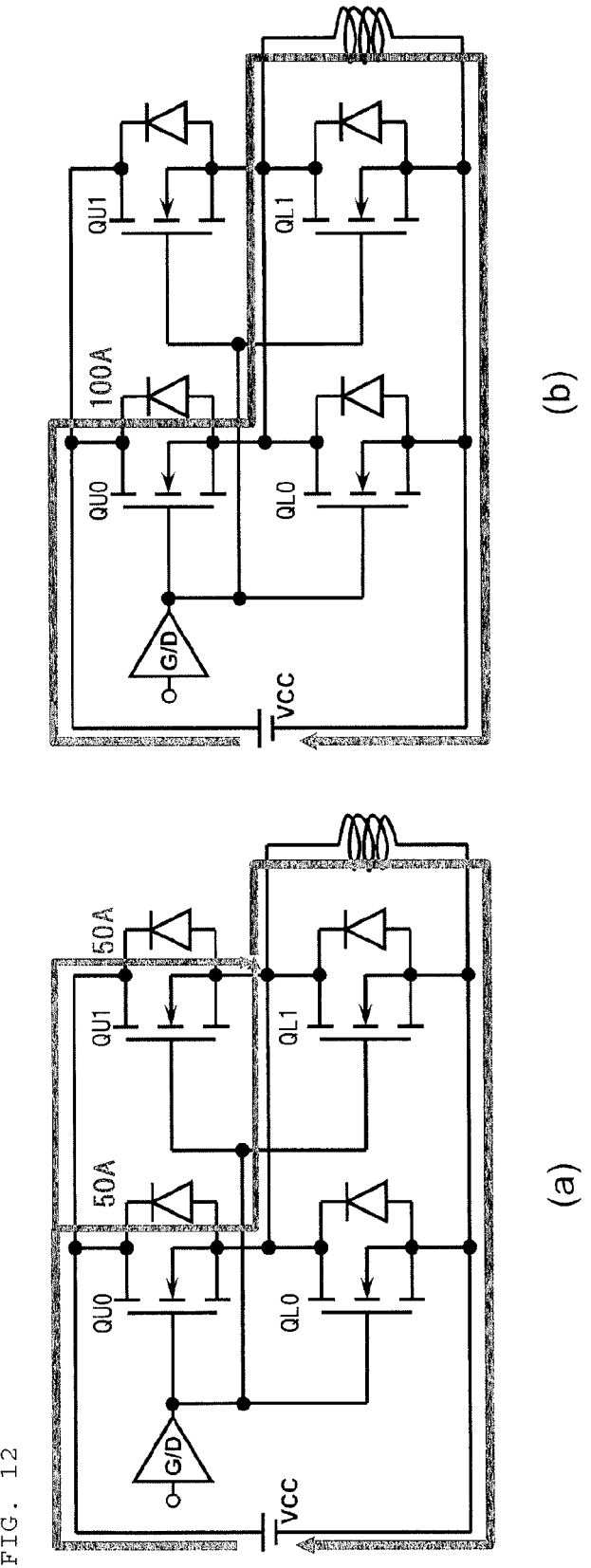
FIG. 12 is an explanatory view illustrating an example of a situation in which an uneven return current flows at the time of inverter operation.

FIG. 10(a) is an example of an embodiment of the switching element of FIG. 8(a), and FIG. 10(b) is a cross-sectional view illustrating a configuration example taken along the lines a-a' of FIG. 10(a). In the example of FIG. 10(a) and FIG. 10(b), the switching element SW made of SiC MOS is mounted on a metal plate PLT in a package. The drain electrode DRm of SW is connected to a drain terminal DT via the metal plate PLT, and the source pad SP is connected to a source terminal ST with the use of a bonding wire Wsm or the like, and the gate pad GP is connected to a gate terminal GT with the use of a bonding wire Wgm or the like. Note that, for the sake of easy illustration, FIG. 10(b) is illustrated assuming that a-a' is along Wgm and is also along DT.

By placing the chip and providing a connection configuration as described above, a length of the bonding wire Wgm connected to the SiC MOS gate pad GP and a length of the bonding wire Wsm connected to the source pad SP can be shortened. That is, parasitic inductances of the bonding wires and parasitic resistances (on-resistance components) caused by the wires can be reduced. Thus, a noise at the time of switching can be suppressed to be small, and therefore it is possible to prevent biasing of an excessive potential to SiC MOS. Furthermore, in this example, because the chip is placed in a planar manner, a chip area of SiC MOS can be freely designed. With this, a low on-resistance and an on-state current density can be easily designed. This makes it possible to achieve power semiconductor chips having various kinds of specification.

REFERENCE SIGNS LIST

GDCTL . . . gate drive control circuit
G/D, GDU, GDV, GDW, GDX, GDY, GDZ, GDR, GD . . . gate drive circuit
HIN . . . H-side input signal
LIN . . . L-side input signal
REF . . . detection activation signal
VDD, VCC . . . power supply voltage
VB . . . high-voltage side power supply level
HO0, HO1 . . . upper-arm switch control signal
VS . . . high-voltage side source level
VEH0, VEH1 . . . high-voltage side sense signal
VDD . . . low-voltage side power supply level
LO0, LO1 . . . lower-arm switch control signal
COM . . . low-voltage side source level
VEL0, VEL1 . . . low-voltage side sense signal
UIN . . . RSL output signal
DIN . . . level shift circuit output signal
R, R1, R2 . . . resistor
HTRGH, SHTRGL . . . Schmitt trigger circuit
LEVELSHIFT . . . level shift circuit
LVS . . . level shift circuit
NM, MN0, MN1 . . . NMOS transistor
UVDETECT . . . voltage detection protection circuit
PULSEFILTER . . . pulse filter
RSL . . . latch circuit
DELAYh, DELAY1 . . . delay circuit
DELAYCTL0, DELAYCTL1 . . . delay time control circuit
PULSEGEN . . . pulse generating circuit
G/D . . . gate drive circuit
DTCKTa, DTCKTb . . . detection circuit
QL0, QL1 . . . switching element
SEP0, SEP1 . . . sense node
VEL0, VEL1 . . . low-voltage side sense signal
ID0, ID1 . . . drain current
RS0, RS1 . . . sense resistor
DELa, DELb . . . delay circuit
Dia0, Dia1, Dib0, Dib1 . . . flip-flop output signal
DF0, DF1 . . . flip-flop circuit
OP0, OP1 . . . comparator output signal
COM0, COM1 . . . comparator
Vref0, Vref1 . . . reference power supply
VEL1 . . . low-voltage side sense signal
LOAD . . . load
DLY0, DLY1, DLY2, DLY3 . . . delay element
n0, n1, n2, n3, n4, n5, n6, n7 . . . circuit node
NOR0, NOR1, NOR2, NOR3 . . . OR circuit
NAND0, NAND1, NAND2, NAND3 . . . AND circuit
IS0, IS1 . . . sense current
NOR1, NOR2, NOR3 . . . OR circuit
INVD0, INVD1 . . . inverting circuit
Mp0, Mp1 . . . PMOS transistor
VSS . . . low level
td0, td1, td2, td3 . . . delay time
δt . . . circuit propagation delay time
Diu, Div, Diw, Dix, Diy, Diz . . . diode
UDRAIN, VDRAIN, WDRAIN, XDRAIN . . . drain node
USOURCE, VSOURCE, WSOURCE, XSOURCE . . . source node
U . . . U phase
V . . . V phase
W . . . W phase
SESIG0, SESIG1 . . . sense control terminal
GSIG0, GSIG1 . . . gate control terminal
PT . . . positive-side connection terminal
NT . . . negative-side connection terminal
MU . . . connection terminal
PM . . . power module
PLATE . . . metal plate C0, C1 . . . capacitor
SWU, SWV, SWW, SWX, SWY, SWZ, SWU0, SWU1, SWX0, SWX1 . . . switch unit
Q1, Q2, Q3, Q4, Q5 . . . switching element
L . . . coil
TR . . . transformer
DCAC . . . inverter apparatus
PFC . . . booster circuit
LINFIL . . . line filter
RCT . . . rectifier circuit
Di . . . chopper diode
SiO2 . . . oxide film
ACT . . . active element region of MOSFET
TM . . . termination region of of MOSFET
DFT . . . drift layer of MOSFET
SUB . . . substrate layer of MOSFET
DRm . . . drain layer of MOSFET
GP, GPm . . . gate pad
SP, SPm . . . source pad
Lay1 . . . insulating film layer
SEP . . . sense pad
Tox . . . gate insulating film
A, A' . . . element cross-sectional region position
N+ . . . source layer
P . . . base layer
SiC MOS . . . MOSFET element made of silicon carbide
GP . . . gate pad
SP . . . source pad
SUB . . . substrate
Gpm . . . gate electrode
SPm . . . source electrode
ST . . . source terminal
Wgm . . . gate wire
Wsm . . . source wire
δVtn, δVtp, ΔVt . . . change in threshold

The invention claimed is:

1. A power conversion apparatus, comprising:
a plurality of first transistor switch groups inserted between a first power supply voltage and an output node;
a second transistor switch group inserted between a second power supply voltage higher than the first power supply voltage and the output node;
a first drive circuit group for controlling on/off of the first transistor switch groups; and
a second drive circuit group for controlling on/off of the second transistor switch group, wherein
sense resistors for detecting a drain current are connected to the plurality of first transistor switch groups and the second transistor switch group;
the first drive circuit group and the second drive circuit group each include respective sense nodes for monitoring respective sense currents flowing through the sense resistors and a plurality of delay circuits; and
the power conversion apparatus further comprises a delay control circuit configured to control activation and non-activation of the plurality of the delay circuits on the basis of a magnitude of the sense current, such that a return current is equally divided among said plurality of first transistor switch groups and second transistor switch group.

2. The power conversion apparatus according to claim 1, wherein
the power conversion apparatus is applied to an inverter circuit;
the first transistor groups are included in an upper arm of the inverter circuit; and
the first transistor groups are included in the upper arm of the inverter circuit.

3. The power conversion apparatus according to claim 1, wherein
each switching element configuring the transistor switch groups includes, in a chip of the each switching element, means for outputting the sense current in addition to means for outputting the drain current.

4. The power conversion apparatus according to claim 1, wherein
the first and second drive circuit groups include at least two different reference power supplies.

5. The power conversion apparatus according to claim 1, wherein
the first and second drive circuit groups have a delay time generating circuit; and
the delay time generating circuit controls a rising time of each of the switching elements of the transistor switch groups.

6. The power conversion apparatus according to claim 1, wherein
each of the first and second drive circuit groups have a control circuit for controlling activation and non-activation of the delay circuits; and
the first and second drive circuit groups determine operation or non-operation of the control circuit in response to reception of a control signal.

7. A power conversion apparatus, comprising:
a plurality of first transistor switch groups inserted between a first power supply voltage and an output node;
a second transistor switch group inserted between a second power supply voltage higher than the first power supply voltage and the output node;
a first drive circuit group for controlling on/off of the first transistor switch groups; and
a second drive circuit group for controlling on/off of the second transistor switch group, wherein:
sense resistors for detecting a drain current are connected to the plurality of first transistor switch groups and the second transistor switch group;
the first drive circuit group and the second drive circuit group each include respective sense nodes for monitoring respective sense currents flowing through the sense resistors and a plurality of delay circuits; and
rising times of the plurality of transistor switch groups are controlled on the basis of the sense currents in a switching time period subsequent to a switching time period in which the sense currents have been monitored, such that a return current is equally divided among said plurality of first transistor switch groups and second transistor switch group.

8. The power conversion apparatus according to claim 7, wherein
the power conversion apparatus is applied to an inverter circuit;
the first transistor groups are included in an upper arm of the inverter circuit; and
the first transistor groups are included in the upper arm of the inverter circuit.

9. The power conversion apparatus according to claim 7, wherein
each switching element configuring the transistor switch groups includes, in a chip of the each switching element, means for outputting the sense current in addition to means for outputting the drain current.

10. The power conversion apparatus according to claim 7, wherein the first and second drive circuit groups include at least two different reference power supplies.

11. The power conversion apparatus according to claim 7, wherein the first and second drive circuit groups have a delay time generating circuit; and the delay time generating circuit controls a rising time of each of the switching elements of the transistor switch groups.

12. The power conversion apparatus according to claim 7, wherein each of the first and second drive circuit groups have a control circuit for controlling activation and non-activation of the delay circuits; and the first and second drive circuit groups determine operation or non- operation of the control circuit in response to reception of a control signal.

\* \* \* \* \*